United States Patent
Chen et al.

(10) Patent No.: US 9,355,834 B2
(45) Date of Patent: May 31, 2016

(54) ADHESIVE TRANSFER

(75) Inventors: Chien-Hua Chen, Corvallis, OR (US); Michael G. Groh, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 133 days.

(21) Appl. No.: 14/117,773

(22) PCT Filed: Jul. 28, 2011

(86) PCT No.: PCT/US2011/045692
§ 371 (c)(1),
(2), (4) Date: Nov. 14, 2013

(87) PCT Pub. No.: WO2013/015814
PCT Pub. Date: Jan. 31, 2013

(65) Prior Publication Data
US 2014/0106142 A1   Apr. 17, 2014

(51) Int. Cl.
| | | |
|---|---|---|
| G09F 3/10 | (2006.01) | |
| B32B 37/02 | (2006.01) | |
| H01L 21/02 | (2006.01) | |
| H01L 23/00 | (2006.01) | |
| H01L 25/065 | (2006.01) | |
| H01L 41/313 | (2013.01) | |

(52) U.S. Cl.
CPC ........ *H01L 21/02* (2013.01); *G09F 3/10* (2013.01); *H01L 24/27* (2013.01); *H01L 24/83* (2013.01); *H01L 24/29* (2013.01); *H01L 24/32* (2013.01); *H01L 24/33* (2013.01); *H01L 25/0657* (2013.01); *H01L 41/313* (2013.01); *H01L 2221/68368* (2013.01); *H01L 2224/27003* (2013.01); *H01L 2224/2919* (2013.01); *H01L 2224/32145* (2013.01); *H01L 2224/32225* (2013.01); *H01L 2224/33181* (2013.01); *H01L 2224/8385* (2013.01); *Y10T 428/24851* (2015.01)

(58) Field of Classification Search
CPC ...... C09J 2203/10; C09J 2203/30; G09F 3/10; B32B 37/025; C08J 2203/10; C08J 2203/30; C09F 3/10
USPC .................................................. 156/235, 249
See application file for complete search history.

(56) References Cited

U.S. PATENT DOCUMENTS

| | | | |
|---|---|---|---|
| 6,284,708 B1 * | 9/2001 | Oshima et al. ................ 503/227 |
| 6,302,523 B1 | 10/2001 | Smith et al. | |
| 6,982,022 B2 | 1/2006 | Clark et al. | |
| 7,275,817 B2 | 10/2007 | Clark et al. | |

(Continued)

FOREIGN PATENT DOCUMENTS

| | | |
|---|---|---|
| JP | 2004326011 | 11/2005 |
| JP | 2008108773 | 5/2008 |

(Continued)

OTHER PUBLICATIONS

Kropp, Michael (Ph.D.) et al., "Innovations in IC Packaging Adhesives", Electro IQ, The Portal for Electronics Manufacturing, Retrieved on Jul. 5, 2011, 8 pgs.

*Primary Examiner* — Bruce H Hess
(74) *Attorney, Agent, or Firm* — Rathe Lindenbaum LLP

(57) ABSTRACT

An adhesive transfer method includes depositing an adhesive on a first substrate, transferring a layer of the adhesive from the first substrate to an intermediate substrate, and transferring adhesive from the layer of the adhesive to at least one area of a second substrate.

19 Claims, 4 Drawing Sheets

(56) References Cited

U.S. PATENT DOCUMENTS 7,690,551 B2 4/2010 You Yang
7,891,798 B2 2/2011 Andrews et al.
2008/0239022 A1 10/2008 Andrews et al.

FOREIGN PATENT DOCUMENTS

KR 19980042841 8/1998
KR 20030089496 11/2003

* cited by examiner

ADHESIVE TRANSFER

BACKGROUND

Semiconductor die, wafers, and/or substrates may be joined to other semiconductor die, wafers, and/or substrates with an adhesive. Application of adhesive to the semiconductor die, wafers, and/or substrates to be joined, however, may be complicated by topography of the semiconductor die, wafers, and/or substrates. In addition, establishing a uniform layer of adhesive on the areas of the semiconductor die, wafers, and/or substrates to be joined may be challenging.

DETAILED DESCRIPTION

In the following detailed description, reference is made to the accompanying drawings which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples of the present disclosure can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

Figure 1:
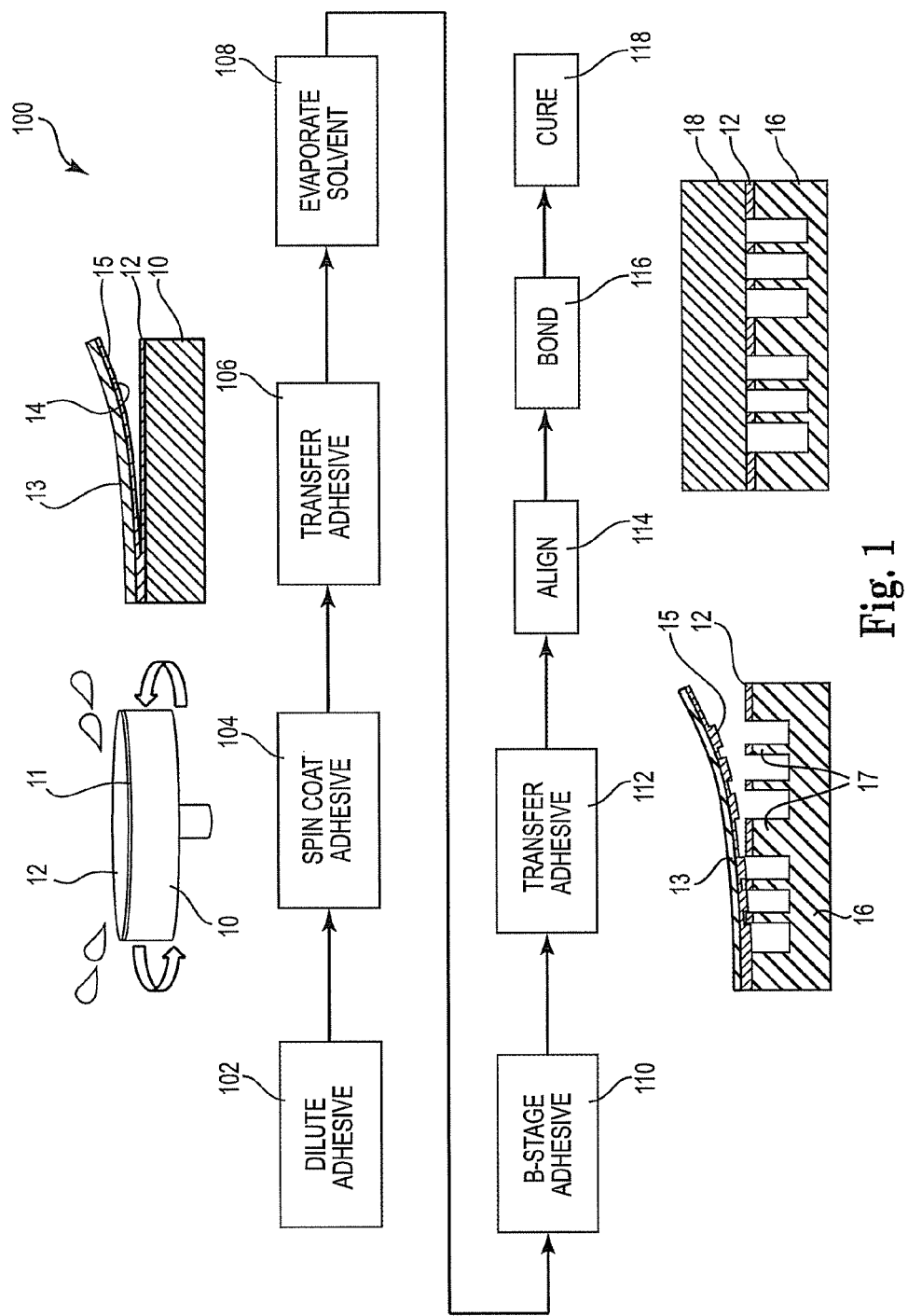
FIG. 1 schematically illustrates one example of an adhesive transfer and bonding process.

FIG. 1 schematically illustrates one example of an adhesive transfer and bonding process 100. At 102, process 100 includes reducing viscosity (i.e., increasing flowability) of an adhesive used in process 100. An example of an adhesive used in process 100 includes a dual-cure adhesive such as EMS 405-57 from Engineered Materials Systems Inc.

Reducing viscosity of the adhesive helps facilitate dispensing and depositing of the adhesive during subsequent processing. In one example, viscosity of the adhesive is reduced by diluting or thinning the adhesive with a solvent. An example of a solvent used for diluting or thinning the adhesive in process 100 includes cyclopentanone.

At 104, process 100 includes depositing the diluted adhesive on a dummy wafer or donor substrate 10. More specifically, a layer of diluted adhesive 12 is deposited on a surface 11 of donor substrate 10. In one example, adhesive 12 is deposited on surface 11 of donor substrate 10 by spin coating.

Next, at 106, process 100 includes transferring adhesive 12 from donor substrate 10 to an intermediate or carrier substrate 13. An example of a material used for intermediate or carrier substrate 13 includes a flexible film including a polyester film such as Mylar.

In one example, transferring adhesive 12 from donor substrate 10 to intermediate or carrier substrate 13 includes contacting or pressing a surface 14 of intermediate or carrier substrate 13 against adhesive 12 deposited on donor substrate 10. As such, adhesive 12 is transferred to surface 14 of intermediate or carrier substrate 13 such that a layer 15 of adhesive 12 is formed on intermediate or carrier substrate 13 and remains on intermediate or carrier substrate 13 when intermediate or carrier substrate 13 is separated, peeled, or removed from donor substrate 10.

In one example, layer 15 of adhesive 12 is a substantially uniform layer, and has a thickness less than a total thickness of adhesive 12 deposited on donor substrate 10 such that a layer of adhesive 12 remains on donor substrate 10 after transferring adhesive 12 to intermediate or carrier substrate 13.

After transferring adhesive 12 to carrier substrate 13, at 108, process 100 includes removing the solvent from adhesive 12 of layer 15. In one example, removing the solvent from adhesive 12 includes heating layer 15 of adhesive 12 and carrier substrate 13 at a predetermined temperature for a predetermined time so as to evaporate the solvent from adhesive 12.

In one example, at 110, process 100 includes partially cross-linking or "B-staging" adhesive 12 as provided on carrier substrate 13. In one example, partially cross-linking or "B-staging" adhesive 12 includes semi-curing adhesive 12 by exposing layer 15 of adhesive 12 to ultra-violet (UV) light. Partially cross-linking or "B-staging" adhesive 12 essentially "freezes" adhesive 12 in position to reduce wicking of adhesive 12, and reduces a tack of adhesive 12 such that carrier substrate 13 with layer 15 of adhesive 12 may be "staged" or held for a period of time, and/or may be more easily handled during subsequent processing.

At 112, process 100 includes transferring adhesive 12 of layer 15 from carrier substrate 13 to a device wafer or substrate 16. In one example, device wafer or substrate 16 includes a patterned substrate having a topography of raised portions or areas 17. As such, transferring adhesive 12 of layer 15 from carrier substrate 13 to substrate 16 includes transferring adhesive 12 to raised portions or areas 17 of substrate 16.

In one example, transferring adhesive 12 from carrier substrate 13 to substrate 16 includes pressing layer 15 of adhesive 12 against substrate 16 and contacting raised portions or areas 17 of substrate 16 with layer 15 of adhesive 12. As such, adhesive 12 from layer 15 is transferred to raised portions or areas 17 of substrate 16 and remains on raised portions or areas 17 of substrate 16 when carrier substrate 13 is separated, peeled, or removed from substrate 16. Thus, a pattern of adhesive 12 transferred to substrate 16 follows and is aligned with a pattern of substrate 16 such that adhesive 12 transferred to substrate 16 is self-patterned and self-aligned.

Partially cross-linking or "B-staging" adhesive 12 (as described, for example, at 110) reduces wicking of adhesive 12 so that adhesive 12, after transfer at 112, remains on raised portions or areas 17 of substrate 16 instead of wicking into recessed areas or regions among raised portions or areas 17 of substrate 16.

At 114 of process 100, substrate 16 with self-patterned and self-aligned adhesive 12 is aligned with another substrate 18 for bonding with substrate 18 such that at 116 of process 100, substrate 16 and substrate 18 are bonded together by adhesive 12. In one example, substrate 16 and substrate 18 are bonded together by placing substrate 16 and substrate 18 in a thermal bonding machine at a predetermined temperature for a predetermined time. Thereafter, at 118 of process 100, adhesive 12 is cured by heating substrates 16 and 18 at a predetermined temperature for a predetermined time.

Figure 2:
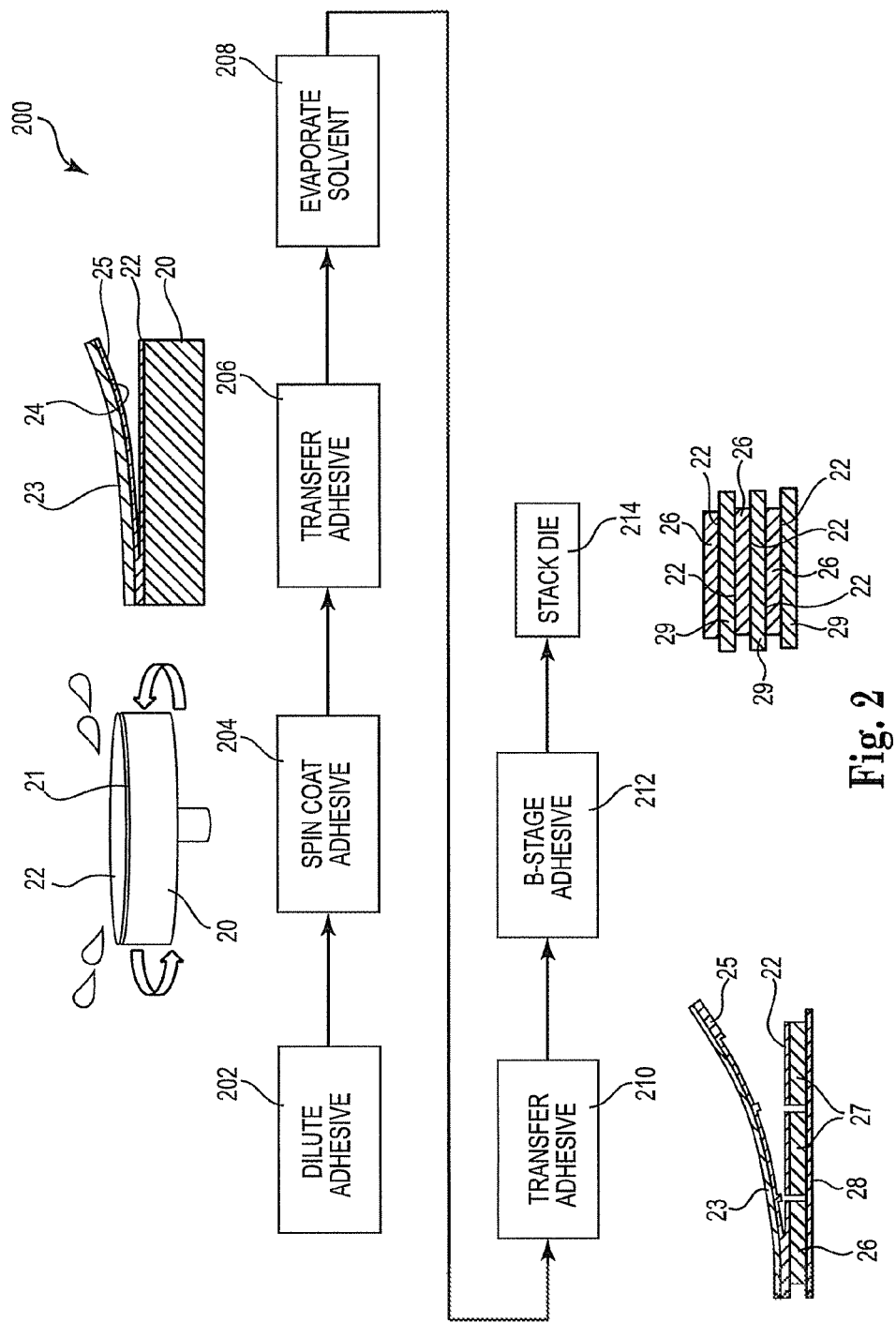
FIG. 2 schematically illustrates another example of an adhesive transfer and bonding process.

FIG. 2 schematically illustrates another example of an adhesive transfer and bonding process 200. At 202, process 200, similar to process 100, includes reducing viscosity of an adhesive used in process 200. Similar to 102 of process 100, viscosity of the adhesive is reduced by diluting or thinning the adhesive with a solvent.

At 204, process 200 includes depositing the diluted adhesive on a dummy wafer or donor substrate 20. More specifically, a layer of diluted adhesive 22 is deposited on a surface 21 of donor substrate 20. In one example, similar to 104 of process 100, adhesive 22 is deposited on surface 21 of donor substrate 20 by spin coating.

Next, at 206, process 200 includes transferring adhesive 22 from donor substrate 20 to an intermediate or carrier substrate 23. An example of a material used for intermediate or carrier substrate 23 includes a flexible film including a polyester film such a Mylar.

In one example, similar to 106 of process 100, transferring adhesive 22 from donor substrate 20 to intermediate or carrier substrate 23 includes contacting or pressing a surface 24 of intermediate or carrier substrate 23 against adhesive 22 deposited on donor substrate 20. As such, adhesive 22 is transferred to surface 24 of intermediate or carrier substrate 23 such that a layer 25 of adhesive 22 is formed on intermediate or carrier substrate 23 and remains on intermediate or carrier substrate 23 when intermediate or carrier substrate 23 is separated, peeled, or removed from donor substrate 20.

In one example, similar to layer 15 of adhesive 12, layer 25 of adhesive 22 is a substantially uniform layer, and has a thickness less than a total thickness of adhesive 22 deposited on donor substrate 20 such that a layer of adhesive 22 remains on donor substrate 20 after transferring adhesive 22 to intermediate or carrier substrate 23.

After transferring adhesive 22 to carrier substrate 23, at 208, process 200 includes removing the solvent from adhesive 22 of layer 25. In one example, similar to 108 of process 100, removing the solvent from adhesive 22 includes heating layer 25 of adhesive 22 and carrier substrate 23 at a predetermined temperature for a predetermined time so as to evaporate the solvent from adhesive 22.

At 210, process 200 includes transferring adhesive 22 of layer 25 from carrier substrate 23 to a semiconductor die or substrate 26. In one example, semiconductor die or substrate 26 includes a patterned substrate formed by a singulated wafer resulting in a topography of raised portions or areas 27 on a backing member (e.g., saw tape) 28. As such, transferring adhesive 22 from carrier substrate 23 to substrate 26 includes transferring adhesive 22 to raised portions or areas 27 of substrate 26.

In one example, similar to 112 of process 100, transferring adhesive 22 from carrier substrate 23 to substrate 26 includes pressing layer 25 of adhesive 22 against substrate 26 and contacting raised portions or areas 27 of substrate 26 with layer 25 of adhesive 22. As such, adhesive 22 from layer 25 is transferred to raised portions or areas 27 of substrate 26 and remains on raised portions or areas 27 of substrate 26 when carrier substrate 24 is separated, peeled, or removed from substrate 26. Thus, a pattern of adhesive 22 transferred to substrate 26 follows and is aligned with a pattern of substrate 26 such that adhesive 22 transferred to substrate 26 is self-patterned and self-aligned.

In one example, at 212, process 200 includes partially cross-linking or "B-staging" adhesive 22 as provided on substrate 26. In one example, partially cross-linking or "B-staging" adhesive 22 includes semi-curing adhesive 22 by exposing adhesive 22 to ultra-violet (UV) light. Partially cross-linking or "B-staging" adhesive 22 essentially "freezes" adhesive 22 in position to reduce wicking of adhesive 22, and reduces a tack of adhesive 22 such that substrate 26 with self-patterned and self-aligned adhesive 22 may be "staged" or held for a period of time, and/or may be more easily handled during subsequent processing. Partially cross-linking or "B-staging" adhesive 22 also reduces wicking of adhesive 12 into areas or regions between raised portions or areas 27 of substrate 26 or along edges of substrate 26 after transfer at 210.

At 214 of process 200, substrate 26 with self-patterned and self-aligned adhesive 22 is stacked with another silicon or semiconductor die or substrate 29 for bonding to silicon or semiconductor die or substrate 29 with adhesive 22.

Figure 3:
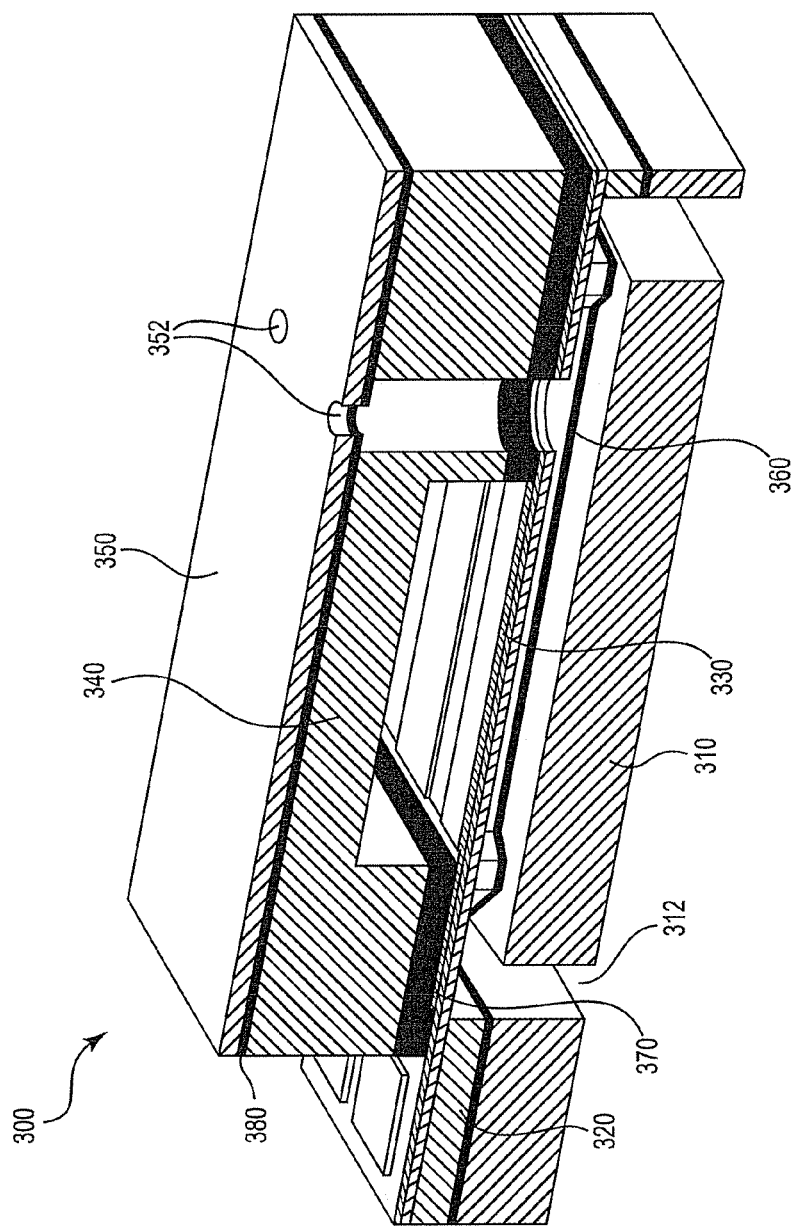
FIG. 3 illustrates one example of application of an adhesive transfer and bonding process.

FIG. 3 illustrates one example of application of an adhesive transfer and bonding process as described herein. In one example, adhesive transfer and bonding process 100 and/or adhesive transfer and bonding process 200 is used in fabrication of a fluid ejection device 300.

Schematically illustrated in cross-section in FIG. 3, one example of fluid ejection device 300 includes an electronics wafer or substrate 310, a piezoelectric wafer or substrate 320 attached to electronics wafer 310, a piezoelectric element 330 supported by piezoelectric wafer 320, a cap wafer or substrate 340 attached to piezoelectric wafer 320, and a nozzle plate 350 attached to cap wafer 340.

In one example, piezoelectric wafer 320 is attached to electronics wafer 310 with an adhesive layer 360 formed using adhesive transfer and bonding process 100 and/or adhesive transfer and bonding process 200. In addition, in one example, cap wafer 340 is attached to piezoelectric wafer 320 with an adhesive layer 370 formed using adhesive transfer and bonding process 100 and/or adhesive transfer and bonding process 200, and nozzle plate 350 is attached to cap wafer 340 with an adhesive layer 380 also formed using adhesive transfer and bonding process 100 and/or adhesive transfer and bonding process 200.

In one example, electronics wafer 310 includes a fluid (or ink) feed hole 312 communicated with a supply of fluid (or ink), and piezoelectric wafer 320 includes fluidic routing communicated with fluid feed hole 312 of electronics wafer 310 such that application of an electrical signal to piezoelectric element 330 deflects piezoelectric element 330 and ejects fluid (or ink) through cap wafer 340 and out a nozzle 352 of nozzle plate 350.

Figure 4:
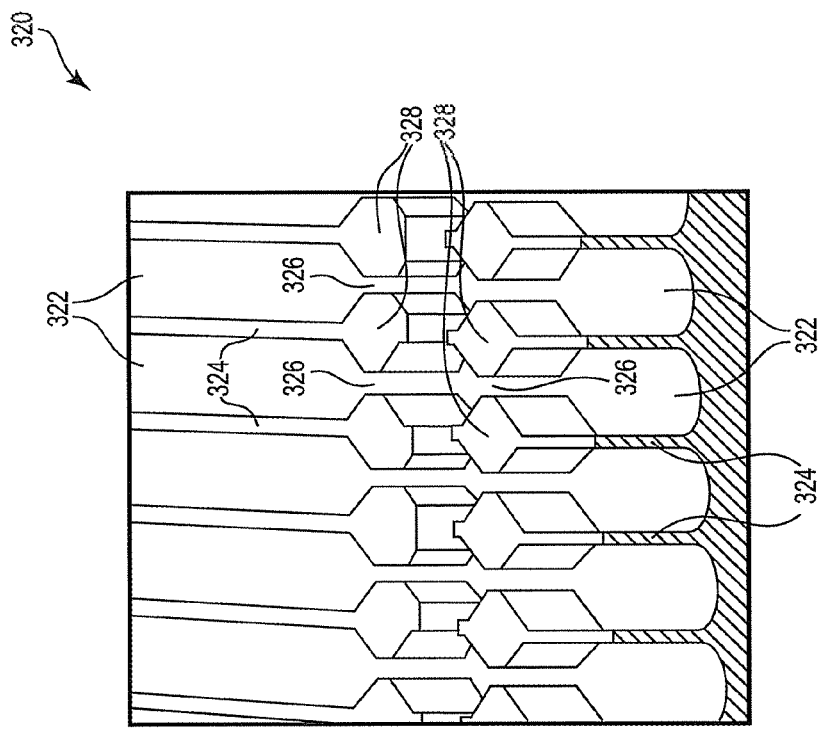
FIG. 4 illustrates one example of application of an adhesive transfer and bonding process.

In one example, as illustrated in FIG. 4, fluidic routing of piezoelectric wafer 320 includes fluid channels 322 separated and formed by spaced ribs 324, and includes pinch points 326 communicated with fluid channels 322 and formed by spaced posts 328. Using adhesive transfer and bonding process 100 and/or adhesive transfer and bonding process 200, adhesive is applied to ribs 324 and posts 328 for bonding of piezoelectric wafer 320 to electronics wafer 310. By using adhesive transfer and bonding process 100 and/or adhesive transfer and bonding process 200, a layer of self-patterned and self-aligned adhesive is applied to ribs 324 and posts 328 without blocking fluid channels 322 or spilling over the edges of ribs 324 to adjacent fluid channels 322, and without blocking pinch points 326 or spilling over the edges of posts 328.

By using adhesive transfer and bonding process 100 and/or adhesive transfer and bonding process 200, as described herein, a self-aligned and self-patterned adhesive layer may be formed on a semiconductor die, wafer, and/or substrate while minimizing wicking or flow of adhesive beyond edges of an intended application area for the adhesive. In addition, with adhesive transfer and bonding process 100 and/or adhesive transfer and bonding process 200, a thin layer of adhesive of substantially uniform thickness providing for a thin bond line may be selectively applied to a semiconductor die, wafer, and/or substrate having a topography of small or narrow features.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. An adhesive transfer method, comprising:
   depositing an adhesive on a first substrate;
   transferring a layer of the adhesive from the first substrate to an intermediate substrate; and
   transferring adhesive from the layer of the adhesive to at least one area of a second substrate, wherein transferring adhesive from the layer of the adhesive to the at least one area of the second substrate comprises contacting at least one raised portion of the second substrate with the adhesive, transferring the adhesive to the at least one raised portion of the second substrate, and separating the intermediate substrate and the second substrate.

2. The method of claim 1, wherein depositing the adhesive on the first substrate comprises spin coating the adhesive on the first substrate.

3. The method of claim 2, further comprising:
   before spin coating the adhesive on the first substrate, reducing a viscosity of the adhesive.

4. The method of claim 1, further comprising:
   after transferring the layer of the adhesive from the first substrate to the intermediate substrate, heating the intermediate substrate and the layer of the adhesive.

5. The method of claim 1, further comprising:
   at least one of before transferring adhesive from the layer of the adhesive to the at least one area of the second substrate and after transferring adhesive from the layer of the adhesive to the at least one area of the second substrate, reducing a tack of the adhesive.

6. The method of claim 1, wherein transferring the layer of the adhesive from the first substrate to the intermediate substrate comprises contacting the adhesive with a surface of the intermediate substrate, transferring the layer of the adhesive to the surface of the intermediate substrate, and separating the intermediate substrate and the first substrate.

7. The method of claim 1, wherein the second substrate comprises electronics.

8. The method of claim 1, wherein the second substrate comprises a fluid passage.

9. The method of claim 1 further comprising partially cross-linking the layer of the adhesive on the intermediate substrate.

10. The method of claim 1 further comprising evaporating solvent from the layer of adhesive on the intermediate substrate.

11. A method of adhesive bonding, comprising:
    coating a surface of a donor substrate with an adhesive;
    transferring a layer of the adhesive from the donor substrate to a carrier substrate;
    transferring adhesive of the layer of the adhesive from the carrier substrate to a patterned substrate; and
    bonding the patterned substrate to another substrate with the adhesive transferred to the patterned substrate.

12. The method of claim 11, wherein coating the surface of the donor substrate with the adhesive comprises spin coating the surface of the donor substrate with the adhesive.

13. The method of claim 12, further comprising:
    before spin coating the adhesive, diluting the adhesive with a solvent.

14. The method of claim 13, further comprising:
    after transferring the layer of the adhesive from the donor substrate to the carrier substrate, evaporating the solvent from the adhesive.

15. The method of claim 11, further comprising:
    at least one of before transferring adhesive of the layer of the adhesive from the carrier substrate to the patterned substrate and after transferring adhesive of the layer of the adhesive from the carrier substrate to the patterned substrate, partially cross-linking the adhesive.

16. The method of claim 11, wherein transferring the layer of the adhesive from the donor substrate to the carrier substrate comprises pressing a surface of the carrier substrate against the adhesive of the donor substrate, transferring the layer of the adhesive to the surface of the carrier substrate, and removing the carrier substrate from the donor substrate.

17. The method of claim 11, wherein transferring adhesive of the layer of the adhesive from the carrier substrate to the patterned substrate comprises contacting raised areas of the patterned substrate with the adhesive, transferring the adhesive to the raised areas of the patterned substrate, and removing the carrier substrate from the patterned substrate.

18. The method of claim 11, wherein the patterned substrate comprises electronics.

19. The method of claim 11, wherein the patterned substrate comprises a fluid passage.

* * * * *